United States Patent
Shi et al.

(10) Patent No.: US 12,446,438 B2
(45) Date of Patent: Oct. 14, 2025

(54) DISPLAY PANELS AND DISPLAY APPARATUSES HAVING THE SAME

(71) Applicants: Chengdu BOE Optoelectronics Technology Co., Ltd., Sichuan (CN); BOE Technology Group Co., Ltd., Beijing (CN)

(72) Inventors: Bo Shi, Beijing (CN); Weiyun Huang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 436 days.

(21) Appl. No.: 17/922,475

(22) PCT Filed: Sep. 1, 2021

(86) PCT No.: PCT/CN2021/116035
§ 371 (c)(1),
(2) Date: Oct. 31, 2022

(87) PCT Pub. No.: WO2022/088960
PCT Pub. Date: May 5, 2022

(65) Prior Publication Data
US 2023/0189618 A1    Jun. 15, 2023

(30) Foreign Application Priority Data

Oct. 30, 2020    (CN) .......................... 202011197835.2

(51) Int. Cl.
*H10K 59/65*    (2023.01)
*G06V 40/16*    (2022.01)
*H10K 59/80*    (2023.01)

(52) U.S. Cl.
CPC ........... *H10K 59/65* (2023.02); *G06V 40/166* (2022.01); *H10K 59/879* (2023.02); *H10K 59/8792* (2023.02)

(58) Field of Classification Search
CPC .. H10K 59/879; H10K 59/8792; H10K 59/65; G06V 40/166; H01L 33/04; H01L 33/62; H01L 27/156
See application file for complete search history.

(56) References Cited

U.S. PATENT DOCUMENTS

2020/0201098 A1    6/2020  Gu et al.
2020/0212130 A1    7/2020  Kim et al.
(Continued)

FOREIGN PATENT DOCUMENTS

CN    205319159 U    6/2016
CN    107422511 A    12/2017
(Continued)

OTHER PUBLICATIONS

PCT/CN2021/116035 international search report.
(Continued)

*Primary Examiner* — Anne M Hines
(74) *Attorney, Agent, or Firm* — IPro, PLLC

(57) ABSTRACT

A display panel (100) and a display apparatus (1000) having the same. The display panel (100) is provided with a preset area (101), a transmitting sensor (201) and a receiving sensor (202) of a time-of-flight device (200) are adapted to be provided on a non-display side of the preset area (101), and light emitted from the transmitting sensor (201) is adapted to be transmitted from the preset area (101) to a display side of the display panel (100), and be reflected by a to-be-detected object on the display side back to a non-display side of the display panel (100), so as to be received by the receiving sensor (202). The display panel (100) includes a substrate layer (11), an organic light-emitting device layer (12), and an anti-reflection layer (13), where the organic light-emitting device layer (12) is provided on a display side of the substrate layer (11); and the anti-reflection layer (13) includes one or more layers and is provided between the substrate layer (11) and the organic light-emitting device layer (12), and at least part of the anti-reflection layer (13) is disposed opposite to the preset area (101) in a thickness direction of the display panel (100).

19 Claims, 2 Drawing Sheets

(56) References Cited

U.S. PATENT DOCUMENTS

2020/0272265 A1* 8/2020 Liu .................. G06F 3/0446
2021/0216163 A1* 7/2021 Wang ................ G02F 1/294

FOREIGN PATENT DOCUMENTS

| | | | |
|---|---|---|---|
| CN | 111223912 A | 6/2020 | |
| CN | 111370457 A | 7/2020 | |
| CN | 111490081 A | 8/2020 | |
| CN | 111754876 A | 10/2020 | |
| CN | 112331710 A | 2/2021 | |
| JP | 2009103793 A | 5/2009 | |

OTHER PUBLICATIONS

PCT/CN2021/116035 Written Opinion.
CN2020111978352 first office action.
CN2020111978352 second office action.
CN2020111978352 Decision of Rejection.

* cited by examiner

DISPLAY PANELS AND DISPLAY APPARATUSES HAVING THE SAME

CROSS-REFERENCE TO RELATED APPLICATIONS

This application is the U.S. national phase of PCT Application No. PCT/CN2021/116035 filed on Sep. 1, 2021, which is based on and claims priority to Chinese Patent Application No. 202011197835.2 filed on Oct. 30, 2020, both of which are incorporated herein by reference in their entireties.

TECHNICAL FIELD

This application relates to the field of display technology, and in particular to a display panel and a display apparatus having the same.

BACKGROUND

More and more electronic devices in the related art have face recognition functions. The face recognition function may be implemented by TOF (short for time of flight) technology. With the development of full screen, a time-of-flight device (TOF device) is placed under a display panel, that is, a high light-transmission area is provided in the display panel, and a transmitting sensor and a receiving sensor of the TOF device are provided under the display panel and opposite to the high light-transmission area. However, due to a reflection effect of infrared rays emitted from the transmitting sensor of the TOF device inside the display panel, the receiving sensor of the TOF device is easily interfered by the infrared rays reflected inside the display panel, resulting in inaccurate distance measurement of a to-be-detected object.

SUMMARY

The present application aims to solve at least one of the technical problems existing in the related art. To this end, the present application provides a display panel, which can improve the accuracy of distance measurement by a time-of-flight device.

The present application further provides a display apparatus having the above display panel.

According to a first aspect of embodiments of the present application, the display panel is provided with a preset area, a transmitting sensor and a receiving sensor of a time-of-flight device are adapted to be provided on a non-display side of the preset area, and light emitted from the transmitting sensor is adapted to be transmitted from the preset area to a display side of the display panel, and be reflected by a to-be-detected object on the display side back to a non-display side of the display panel, so as to be received by the receiving sensor. The display panel includes: a substrate layer; an organic light-emitting device layer provided on a display side of the substrate layer; and an anti-reflection layer including one or more anti-reflection layers and provided between the substrate layer and the organic light-emitting device layer, at least part of the anti-reflection layer being disposed opposite to the preset area in a thickness direction of the display panel.

With the display panel according to embodiments of the present application, at least one anti-reflection layer is provided between the substrate layer and the organic light-emitting device layer, and at least part of the anti-reflection layer is disposed opposite to the preset area, such that reflection of the light emitted from the transmitting sensor inside the display panel can be reduced, thereby improving interference of these reflected light to the light received by the receiving sensor. That is, interference light reflected inside the display panel and entering the receiving sensor can be effectively reduced, thereby improving the accuracy of distance measurement by the time-of-flight device.

In some embodiments, one of the one or more anti-reflection layers is a preset thin film layer, and the preset thin film layer is disposed immediately adjacent to the substrate layer.

In some embodiments, the display panel includes only the preset thin film layer as the anti-reflection layer, and the display panel further includes a buffer layer disposed immediately adjacent to a display side of the preset thin film layer.

In some embodiments, the light emitted from the transmitting sensor has a wavelength of 940 nm, the substrate layer includes polyimide and has a refractive index of 1.945, the buffer layer has a refractive index of 1.467, the preset thin film layer has a refractive index of 1.625 or 1.691, and the preset thin film layer has a thickness of 235 nm.

In some embodiments, a projection of at least one of the one or more anti-reflection layers in the thickness direction of the display panel completely covers the substrate layer.

In some embodiments, a projection of at least one of the one or more anti-reflection layers in the thickness direction of the display panel exactly covers the preset area.

In some embodiments, a refractive index $n_x$ of the anti-reflection layer satisfies: $n-0.2 \leq n_x \leq n+0.2$, where $n=(n_1 \times n_2)^{(1/2)}$, $n_1$ is a refractive index of a film layer immediately adjacent to a non-display side of a corresponding anti-reflection layer, and $n_2$ is a refractive index of a film layer immediately adjacent to a display side of the corresponding anti-reflection layer.

In some embodiments, a thickness $d_x$ of the anti-reflection layer satisfies: $d-50\ nm \leq d_x \leq d+50\ nm$, where $d_x=\lambda/4$, and $\lambda$ is a wavelength of the light emitted from the transmitting sensor.

In some embodiments, an extinction coefficient k of the anti-reflection layer satisfies: $k \leq 1$.

In some embodiments, at least one of the one or more anti-reflection layers is made of polyimide.

In some embodiments, the organic light-emitting device layer includes an electron transport layer, and at least one of the one or more anti-reflection layers is made of the same material as that of the electron transport layer.

The display apparatus according to a second aspect of embodiments of the present application includes: a display panel that is the display panel according to the first aspect of embodiments of the present application; and a time-of-flight device including a transmitting sensor and a receiving sensor both provided on the non-display side of the preset area, where the light emitted from the transmitting sensor is transmitted from the preset area to the display side of the display panel, and is reflected by the to-be-detected object on the display side back to the non-display side of the display panel, so as to be received by the receiving sensor.

The display apparatus according to embodiments of the present application is provided with the display panel according to the first aspect of embodiments of the present application, thereby improving a face recognition function of the display apparatus.

Additional aspects and advantages of the present application will be given in part in the following description, and in part, will be apparent from the following description, or learned from the practice of the present application.

Figure 1:
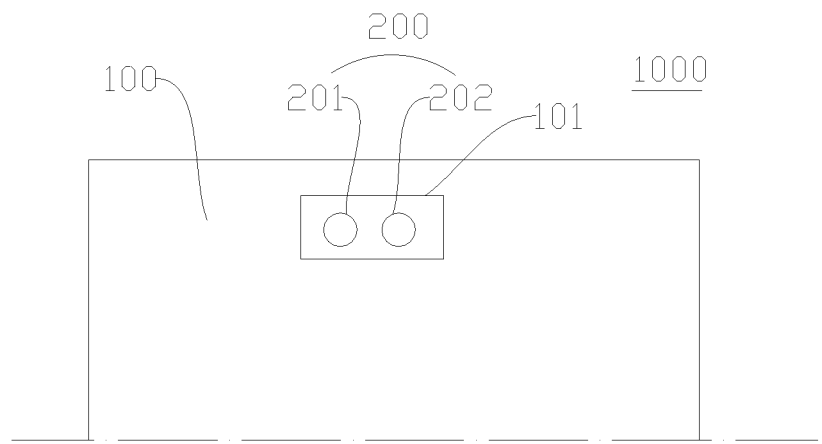
FIG. 1 is a partial schematic diagram of a display apparatus according to an embodiment of the present application.

REFERENCE SIGNS display apparatus 1000; to-be-detected object 2000;
display panel 100; preset area 101;
substrate layer 11;
organic light-emitting device layer 12; anode layer 121; organic light-emitting layer 122;
cathode layer 123;
anti-reflection layer 13; preset thin film layer 130;
buffer layer 14; thin film encapsulation layer 15;
time-of-flight device 200; transmitting sensor 201; receiving sensor 202.

DETAILED DESCRIPTION OF THE EMBODIMENTS

Embodiments of the present application will be described in detail below, examples of which are illustrated in the accompanying drawings, in which the same or similar reference numerals indicate the same or similar elements or elements having the same or similar functions throughout. The embodiments described below with reference to the accompanying drawings are exemplary and are intended to explain the present application, but cannot be construed as limiting the present application.

The following disclosure provides many different embodiments or examples to implement different structures of the present application. In order to simplify the disclosure of the present application, components and settings in specific examples will be described below. However, they are only examples and are not intended to limit the present application. In addition, the present application may repeat reference numerals and/or letters in different examples. This repetition is for the purpose of simplification and clarity, and does not in itself indicate the relationship among various embodiments and/or settings discussed. In addition, the present application provides examples of various specific processes and materials, but those ordinary skilled in the art may be aware of the applicability of other processes and/or the use of other materials.

More and more electronic devices in the related art have face recognition functions. The face recognition function is generally implemented by 3D structured light technology or TOF (short for time of flight) technology. In the case of the 3D structured light technology, a large distance is required between transmitting and receiving sensors, which may reduce a screen-to-body ratio and cause a wide notch to be reserved on a head of a display apparatus. TOF technology is a technology that uses time of flight of light to measure a distance, which has advantages of long detection distance and simple structure compared to the 3D structured light technology, and the distance between the transmitting and receiving sensors may be very small, for example, the distance between the transmitting and receiving sensors may reach the millimeter level, which is conducive to optimization of mechanism design of electronic devices.

In the case of the TOF technology, one scheme is to punch holes in a display panel and provide the transmitting sensor and the receiving sensor under the holes, which makes full-screen display impossible. Another scheme is to provide a high light-transmission area in the display panel and provide the transmitting sensor and the receiving sensor under the display panel and opposite to the high light-transmission area. However, due to a reflection effect of infrared rays emitted from the transmitting sensor inside the display panel, the receiving sensor is easily interfered by the infrared rays reflected inside the display panel, resulting in inaccurate distance measurement and even the phenomenon of distance reversal.

In order to solve at least one of the above technical problems, the present application provides a display panel 100 and a display apparatus 1000, which will be described below with reference to the drawings.

Figure 2:
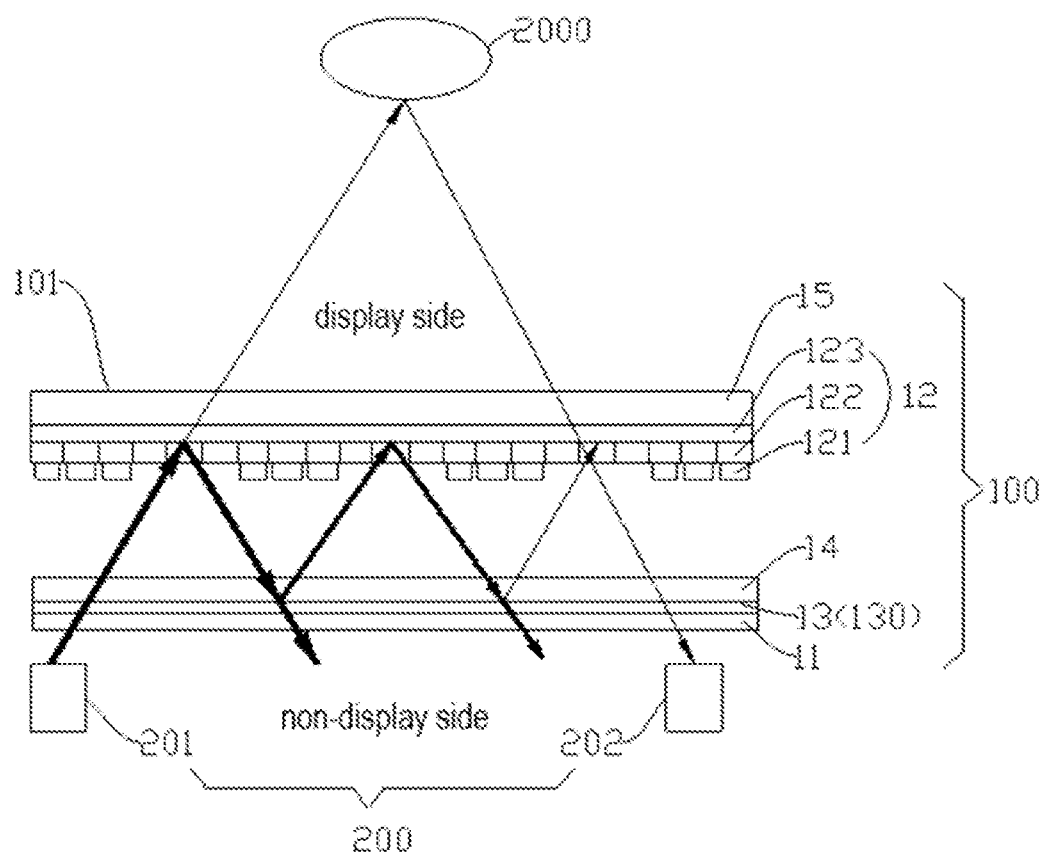
FIG. 2 is a schematic cross-sectional view of a display apparatus according to an embodiment of the present application.

As shown in FIG. 1 and FIG. 2, the display panel 100 according to embodiments of the present application is provided with a preset area 101, a transmitting sensor 201 and a receiving sensor 202 of a time-of-flight device (TOF device) 200 are adapted to be provided on a non-display side of the preset area 101, and light such as infrared rays emitted from the transmitting sensor 201 is adapted to be transmitted from the preset area 101 to a display side of the display panel 100, and be reflected by a to-be-detected object 2000 on the display side back to a non-display side of the display panel 100, so as to be received by the receiving sensor 202. The display panel 100 may include a substrate layer 11, an organic light-emitting device layer (OLED device layer) 12, and an anti-reflection layer 13, where the organic light-emitting device layer 12 is provided on a display side of the substrate layer 11; and the anti-reflection layer 13 includes one or more anti-reflection layers and is provided between the substrate layer 11 and the organic light-emitting device layer 12, and at least part of the anti-reflection layer 13 is disposed opposite to the preset area 101 in a thickness direction of the display panel 100.

It can be understood that the preset area 101 refers to a high light-transmission area in the display panel 100. It can be understood that the display panel 100 further includes a circuit driving layer provided between the substrate layer 11 and the organic light-emitting device layer 12. The circuit driving layer may bypass the high light-transmission area to ensure a high light transmittance of the high light-transmission area, such that the light emitted from the transmitting sensor 201 may exit the display panel 100, and be reflected by the to-be-detected object 2000 back to the display panel 100, so as to be received by the receiving sensor 202. In addition, as shown in FIG. 2, the "display side" and the "non-display side" described herein refer to both sides of the display panel 100 in the thickness direction, and a side of the display panel 100 used for display and facing a user during use is the display side, and the opposite side is the non-display side.

Therefore, with the display panel 100 according to the embodiments of the present application, at least one anti-reflection layer 13 is provided between the substrate layer 11 and the organic light-emitting device layer 12, and at least part of the anti-reflection layer 13 is guaranteed to be disposed opposite to the preset area 101 with a high light transmittance, such that reflection of the light emitted from the transmitting sensor 201 inside the display panel 100 can be reduced, thereby improving interference of these reflected light to the light received by the receiving sensor 202. That is, interference light reflected inside the display panel 100 and entering the receiving sensor 202 can be effectively reduced, thereby improving the accuracy of distance measurement by the time-of-flight device 200 and avoiding the phenomenon of distance reversal.

In addition, in order to solve the above technical problems, in the related art, some people have pointed out that the distance between the transmitting sensor and the receiving sensor may be increased. Although this can improve the reflection crosstalk problem, it runs counter to the advantages of the TOF technology. In addition, some people have thought of cutting off the display panel between the transmitting sensor and the receiving sensor. Although this can reduce the crosstalk, a refractive index of the display panel may change abruptly to lose a waveguide effect, which is also unrealistic. However, with the display panel 100 according to the embodiments of the present application, at least one anti-reflection layer 13 is provided between the substrate layer 11 and the organic light-emitting device layer 12, without increasing the distance between the transmitting sensor 201 and the receiving sensor 202, which is in line with the advantages of the TOF technology. Moreover, there is no need to cut off the display panel 100 between the transmitting sensor 201 and the receiving sensor 202, such that an abrupt change in the refractive index of the display panel 100 can be avoided and loss of the waveguide effect can be avoided.

As above, more and more electronic devices in the related art have face recognition functions. The face recognition function may be implemented by TOF technology. With the development of full screen, a TOF device is placed under a display panel, that is, a high light-transmission area is provided in the display panel, and a transmitting sensor and a receiving sensor of the TOF device are provided under the display panel and opposite to the high light-transmission area. However, due to a reflection effect of infrared rays emitted from the transmitting sensor of the TOF device inside the display panel, the receiving sensor of the TOF device is easily interfered by the infrared rays reflected inside the display panel, resulting in inaccurate distance measurement of a to-be-detected object and even the phenomenon of distance reversal.

In the present application, the anti-reflection layer 13 with an anti-reflection effect is provided inside the display panel 100 to reduce or eliminate the interference of the light (such as infrared rays) reflected inside the display panel 100 to the receiving sensor 202, thereby improving the accuracy of distance measurement by the time-of-flight device 200, shortening the distance between the transmitting sensor 201 and the receiving sensor 202, and avoiding the abrupt change in the refractive index of the display panel 100.

In some embodiments of the present application, one of the one or more anti-reflection layers 13 is a preset thin film layer 130, and the preset thin film layer 130 is disposed immediately adjacent to the substrate layer 11. That is to say, the preset thin film layer 130 is disposed directly on the substrate layer 11, or there is no other film layer between the preset thin film layer 130 and the substrate layer 11. In addition, in the case that the anti-reflection layer 13 includes a plurality of anti-reflection layers, one of the anti-reflection layers 13 is the preset thin film layer 130 and is disposed directly on the substrate layer 11, and the other anti-reflection layers 13 are disposed on a side of the preset thin film layer 130 away from the substrate layer 11. In the case that the anti-reflection layer 13 includes only one anti-reflection layer, the anti-reflection layer 13 is the preset thin film layer 130.

Therefore, by disposing the preset thin film layer 130 on the substrate layer 11, reflection of the light emitted from the transmitting sensor 201 inside the display panel 100 caused by the substrate layer 11 can be effectively reduced, thereby improving the accuracy of distance measurement by the time-of-flight device 200, shortening the distance between the transmitting sensor 201 and the receiving sensor 202, and avoiding the abrupt change in the refractive index of the display panel 100.

The inventor creatively found that the main reasons why the receiving sensor is easily interfered by the infrared rays reflected inside the display panel are that a cathode layer in the organic light-emitting device layer in the display panel has a reflectivity of about 63% to the infrared rays, and the substrate layer in the display panel is a polyimide (PI) layer, which has a reflectivity of about 15% to the infrared rays. At present, the main anti-reflection methods for the cathode layer are thinning and patterning. However, thinning of the cathode layer may be limited by the coating process, and uneven coating may occur when a thickness of the cathode layer is less than 90 nm; while patterning involves equipment modification and new process development, which is difficult to import volume production in the short term.

Therefore, in the present application, an anti-reflection design is carried out for the substrate layer (such as the PI layer). That is, by providing the preset thin film layer 130 for anti-reflection on the substrate layer, the substrate layer can be effectively improved in anti-reflection, reflection of the light (such as infrared rays) inside the display panel 100 can be reduced, and interference light entering the receiving sensor 202 can be reduced. In addition, it should be noted that the substrate layer 11 according to the embodiments of the present application is not limited to the polyimide layer, and may be a layer made of other material, such as a hard material.

In some embodiments of the present application, as shown in FIG. 2, the display panel 100 includes only the preset thin film layer 130 as the anti-reflection layer 13, and the display panel 100 further includes a buffer layer 14 disposed immediately adjacent to a display side of the preset thin film layer 130. In other words, a preset thin film layer 130 is disposed between the substrate layer 11 and the buffer layer 14, with no other film layer between the preset thin film layer 130 and the substrate layer 11, and no other film layer between the preset thin film layer 130 and the buffer layer 14. As a result, while ensuring an improvement in the anti-reflection effect of the substrate layer 11, the structure of the display panel 100 can be simplified, the processing difficulty can be reduced, and the production efficiency can be improved, which is economical and can meet the requirements of volume production.

In some embodiments of the present application, a projection of at least one anti-reflection layer 13 in the thickness direction of the display panel 100 completely covers the substrate layer 11, which is convenient for processing. However, the present application is not limited thereto. In other embodiments of the present application, a projection of at least one anti-reflection layer 13 in the thickness direction of the display panel 100 exactly covers the preset area 101. In other words, the anti-reflection layer 13 may be provided locally for the preset area 101, so as to reduce the cost and ensure no influence on the thickness of the rest of the display panel 100.

Figure 3:
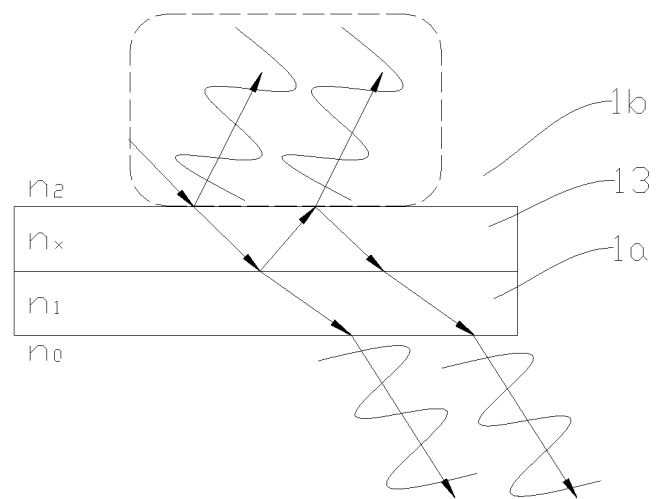
FIG. 3 is a schematic diagram of light interference of a display panel according to an embodiment of the present application.

In some embodiments of the present application, as shown in FIG. 2 and FIG. 3, a refractive index $n_x$ of the anti-reflection layer 13 satisfies: $n-0.2 \leq n_x \leq n+0.2$, for example, $n_x=n-0.2$, $n_x=n-0.1$, $n_x=n$, $n_x=n+0.1$, or $n_x=n+0.2$, where $n=(n_1 \times n_2)^{\wedge}(1/2)$, $n_1$ is a refractive index of a film layer (denoted as a lower film layer 1a) immediately adjacent to a non-display side of a corresponding anti-reflection layer 13, and $n_2$ is a refractive index of a film layer (denoted as an upper film layer 1b) immediately adjacent to a display side of the corresponding anti-reflection layer 13. Therefore, equal inclination interference between the film layers may be utilized to make light interference constructive to achieve anti-reflection, thereby effectively reducing or eliminating the interference of the light reflected inside the display panel 100 to the receiving sensor 202, and improving the accuracy of distance measurement by the time-of-flight device 200.

It should be noted that the term "immediately adjacent to" as described herein means that there is no other film layer between two adjacent film layers. That is, the anti-reflection layer 13 is immediately adjacent to a lower film layer thereof, which means that there is no other film layer between the anti-reflection layer 13 and the lower film layer. The anti-reflection layer 13 is immediately adjacent to an upper film layer thereof, which means that there is no other film layer between the anti-reflection layer 13 and the upper film layer. For example, in the case that a preset thin film layer 130 is provided between the substrate layer 11 and the buffer layer 14, the substrate layer 11 is the lower film layer immediately adjacent to the preset thin film layer 130, the buffer layer 14 is the upper film layer immediately adjacent to the preset thin film layer 130, $n_1$ is the refractive index of the substrate layer 11, and $n_2$ is the refractive index of the buffer layer 14. In addition, it can be understood that there may be a number of anti-reflection layers 13 immediately adjacent to each other. For example, a first anti-reflection layer, a third anti-reflection layer, and a second anti-reflection layer are disposed immediately adjacent to each other in sequence in a direction from the non-display side to the display side, and when calculating the refractive index $n_x$ of the third anti-reflection layer, the refractive index of the first anti-reflection layer is $n_1$ and the refractive index of the second anti-reflection layer is $n_2$, which will not be repeated here.

In some specific examples of the present application, the refractive index $n_x$ of the anti-reflection layer 13 satisfies: $n-0.05 \leq n_x \leq n+0.05$, for example, $n_x=n-0.05$, $n_x=n-0.025$, $n_x=n$, $n_x=n+0.025$, or $n_x=n+0.05$. Therefore, equal inclination interference between the film layers may be better utilized to make light interference constructive to achieve anti-reflection, thereby effectively reducing or eliminating the interference of the light reflected inside the display panel 100 to the receiving sensor 202, and improving the accuracy of distance measurement by the time-of-flight device 200.

In some specific examples of the present application, a thickness $d_x$ of the anti-reflection layer 13 satisfies: $d-50$ nm $\leq d_x \leq d+50$ nm, for example, $d_x=d-50$ nm, $d_x=d-25$ nm, $d_x=d$, $d_x=d+25$ nm, or $d_x=d+50$ nm, where $d_x=\lambda/4$, and $\lambda$ is a wavelength of the light emitted from the transmitting sensor 201. Therefore, an optical path difference is shifted by one-half wavelength after reflection to achieve destructive interference for the reflection and constructive interference for the transmission, thereby effectively reducing or eliminating the interference of the light reflected inside the display panel 100 to the receiving sensor 202, and improving the accuracy of distance measurement by the time-of-flight device 200.

For example, when the light emitted from the transmitting sensor 201 is an infrared ray with a wavelength of 940 nm, the thickness of the anti-reflection layer 13 may be 235 nm. After reflection, an optical path difference is shifted by one-half wavelength to achieve destructive interference for the reflection and constructive interference for the transmission, thereby effectively reducing or eliminating the interference of the light reflected inside the display panel 100 to the receiving sensor 202, and improving the accuracy of distance measurement by the time-of-flight device 200. It should be noted that the wavelength of the light emitted from the transmitting sensor 201 may be selected and not limited, for example, the wavelength may be 920 nm to 960 nm, etc., which will not be repeated here.

In some embodiments of the present application, an extinction coefficient k of the anti-reflection layer 13 satisfies: $k \leq 1$, for example, k is 1, 0.9, 0.8, 0.7, 0.6, 0.5, 0.4, etc. As a result, the accuracy of distance measurement by the time-of-flight device 200 can be better improved. In some specific examples of the present application, an extinction coefficient k of the anti-reflection layer 13 satisfies: $k \leq 0.5$, which can better improve the accuracy of distance measurement by the time-of-flight device 200.

For example, in a specific example of the present application, as shown in FIG. 2, a preset thin film layer 130 is provided between the substrate layer 11 and the buffer layer 14, the wavelength of the light emitted from the transmitting sensor 201 is 940 nm, the substrate layer 11 is a polyimide layer with the refractive index of 1.945 (that is, the refractive index of the polyimide layer for light with a wavelength of 940 nm is 1.945), and the refractive index of the buffer layer 14 is 1.467 (that is, the refractive index of the buffer layer 14 for light with a wavelength of 940 nm is 1.467). According to the above equation, the refractive index $n_x$ of the preset thin film layer 130 is 1.689, and the thickness $d_x$ of the preset thin film layer 130 is 235 nm. It should be noted that, in order to facilitate the selection of materials, a material with a refractive index close to 1.689 may be used, for example, the refractive index of the preset thin film layer 130 may be selected as 1.625 (e.g., corresponding to a polyimide material) or 1.691 (e.g., corresponding to a material of an electron transport layer), etc.

Therefore, equal inclination interference between the film layers may be utilized to make light interference constructive to achieve anti-reflection. After reflection, an optical path difference is shifted by one-half wavelength to achieve destructive interference for the reflection and constructive interference for the transmission, such that a total anti-reflection effect can be achieved, i.e., the anti-reflection effect can be achieved to a greater extent, thereby effectively reducing or eliminating the interference of the light reflected inside the display panel 100 to the receiving sensor 202, and improving the accuracy of distance measurement by the time-of-flight device 200.

In some embodiments of the present application, at least one anti-reflection layer 13 is made of polyimide. As a result, it is easy to obtain and process the material, and the polyimide has a refractive index close to 1.689, which can effectively reduce or eliminate the interference of the light reflected inside the display panel 100 to the receiving sensor 202 and improve the accuracy of distance measurement by the time-of-flight device 200.

For example, in Specific Example 1, the light emitted from the transmitting sensor 201 has a wavelength of 940 nm, the substrate layer 11 is a polyimide layer, and a polyimide layer is coated on the polyimide layer as the preset thin film layer 130, where the polyimide layer has a refractive index of 1.625 and a thickness of 235 nm. The simulation results (Table 1 below) show that after providing the polyimide layer, the reflectivity to the infrared rays with the wavelength of 940 nm is reduced from 14.95% to 2.42%, and the transmittance is increased from 85.05% to 97.58%, which can greatly reduce the distance between the transmitting sensor 201 and the receiving sensor 202.

TABLE 1

| Thickness of preset thin film layer 130 (nm) | Reflectivity to infrared rays | Distance between transmitting sensor 201 and receiving sensor 202 (mm) | Number of pixel units spaced between transmitting sensor 201 and receiving sensor 202 |
|---|---|---|---|
| 0 | 14.95% | 10 | 40 |
| 50 | 22.41% | 21 | 84 |
| 100 | 20.13% | 13.5 | 54 |
| 150 | 9.47% | 6.3 | 25 |
| 200 | 3.89% | 2.6 | 10 |
| 235 | 2.42% | 1.6 | 6 |
| 250 | 5.38% | 3.6 | 14 |
| 300 | 17.17% | 11.5 | 46 |
| 350 | 22.76% | 15.2 | 61 |
| 400 | 18.42% | 12.3 | 49 |

In some embodiments of the present application, the organic light-emitting device layer 12 includes an electron transport layer, and at least one anti-reflection layer 13 is made of the same material as that of the electron transport layer. As a result, it is easy to obtain and process the material, and the material of the electron transport layer has a refractive index close to 1.689, which can effectively reduce or eliminate the interference of the light reflected inside the display panel 100 to the receiving sensor 202 and improve the accuracy of distance measurement by the time-of-flight device 200.

Figure 4:
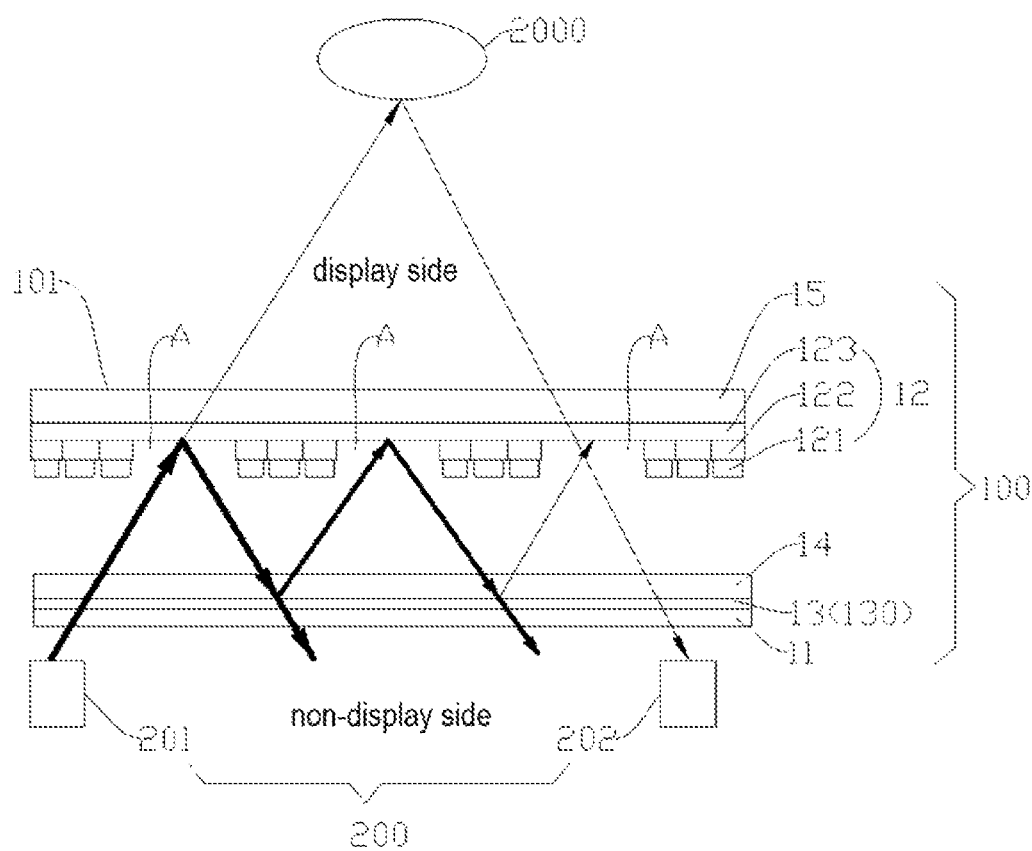
FIG. 4 is a schematic cross-sectional view of a display apparatus according to another embodiment of the present application.

It can be understood that the organic light-emitting device layer 12 includes: an organic light-emitting layer 122; and a cathode layer 123 and an anode layer 121 respectively disposed on both sides of the organic light-emitting layer 122 in a thickness direction thereof. The organic light-emitting layer 122 may include a light-emitting layer, an electron transport layer, an electron injection layer, a hole transport layer, a hole injection layer, etc., which will not be described here. In addition, it is worth mentioning that the organic light-emitting layer 122 may be designed with local holes (e.g., at position A shown in FIG. 4), thereby improving the light-transmission effect of the preset area 101 and further improving the accuracy of distance measurement by the time-of-flight device 200.

For example, in Specific Example 2, the light emitted from the transmitting sensor 201 has a wavelength of 940 nm, the substrate layer 11 is a polyimide layer, and the material of the electron transport layer is evaporated on the polyimide layer as the preset thin film layer 130, where the material of the electron transport layer has a refractive index of 1.691 and a thickness of 235 nm. The simulation results (Table 2 below) show that after providing the preset thin film layer 130, the reflectivity to the infrared rays with the wavelength of 940 nm is reduced from 14.95% to 3.69%, and the transmittance is increased from 85.05% to 96.31%, which can greatly reduce the distance between the transmitting sensor 201 and the receiving sensor 202.

TABLE 2

| Thickness of preset thin film layer 130 (nm) | Reflectivity to infrared rays | Distance between transmitting sensor 201 and receiving sensor 202 (mm) | Number of pixel units spaced between transmitting sensor 201 and receiving sensor 202 |
|---|---|---|---|
| 0 | 14.95% | 10 | 40 |
| 50 | 23.58% | 15.8 | 63 |
| 100 | 21.23% | 14.2 | 57 |
| 150 | 9.37% | 6.3 | 25 |
| 200 | 4.11% | 2.7 | 11 |
| 235 | 3.69% | 2.5 | 10 |
| 250 | 7.34% | 4.9 | 20 |
| 300 | 19.92% | 13.3 | 53 |
| 350 | 23.96% | 16.0 | 64 |
| 400 | 16.81% | 11.2 | 45 |

Hereinafter, a display apparatus 1000 according to some embodiments of the present application will be described.

As shown in FIG. 1 and FIG. 2, the display apparatus 1000 may include a display panel 100 and a time-of-flight device 200. The display panel 100 is the display panel 100 according to any one of the embodiments of the present application. The time-of-flight device 200 includes a transmitting sensor 201 and a receiving sensor 202 both provided on the non-display side of the preset area 101, where the light emitted from the transmitting sensor 201 is transmitted from the preset area 101 to the display side of the display panel 100, and is reflected by the to-be-detected object 2000 on the display side back to the non-display side of the display panel 100, so as to be received by the receiving sensor 202.

Therefore, with the display apparatus 1000 according to the embodiments of the present application, the anti-reflection layer 13 with an anti-reflection effect is provided inside the display panel 100 to reduce or eliminate the interference of the light reflected inside the display panel 100 to the receiving sensor 202, thereby improving the accuracy of distance measurement by the time-of-flight device 200, shortening the distance between the transmitting sensor 201 and the receiving sensor 202, and avoiding an abrupt change in the refractive index of the display panel 100. In this way, the face recognition function of the display apparatus 1000 can be improved to meet the development requirements of full screen.

It should be noted that, the specific position, shape and size of the preset area 101 in the display panel 100 may be set according to actual requirements, and are not limited in the present application. In addition, it should be noted that the display apparatus 1000 according to the embodiments of the present application is not limited in terms of specific type, and the display apparatus 1000 is not limited to having the function of display, as long as it has at least the functions of display and face recognition. For example, the display apparatus 1000 may also have a camera function, a voice call function, an internet access function, etc. For example, the display apparatus 1000 may include a smart phone, a smart wearable device, and the like. In addition, after the specific type of the display apparatus 1000 is determined, other structures and operations of the display apparatus 1000 according to the embodiments of the present application are known to those ordinary skilled in the art, and will not be described in detail here.

In addition, the display panel 100 according to the embodiments of the present application is not limited in terms of specific structure. For example, the display panel 100 may further include a thin film encapsulation layer 15, a pixel definition layer, and so on. In addition, the display panel 100 shown in FIG. 2 is merely schematic, and there may be other functional film layer such as a planarization layer between the organic light-emitting device layer 12 and the buffer layer 14, which are omitted from the drawings here.

In the description of this specification, reference to terms "an embodiment", "some embodiments", "example(s)", "specific example(s)", or "some examples", etc., means that the specific features, structures, materials, or characteristics described in combination with this embodiment or example are included in at least one embodiment or example of the present application. In this specification, the schematic representation of the above terms does not have to be directed to the same embodiment or example. Moreover, the specific features, structures, materials, or characteristics described may be combined in a suitable manner in any one or more embodiments or examples. In addition, those skilled in the art may combine different embodiments or examples described in this specification, as well as the features in different embodiments or examples, without contradiction.

Although embodiments of the present application have been shown and described, it can be understood by those ordinary skilled in the art that various changes, modifications, replacements and variants of these embodiments may be made without departing from the principles and purposes of the present application, the scope of which is limited by the claims and their equivalents.

The invention claimed is:

1. A display panel, wherein the display panel is provided with a preset area, a transmitting sensor and a receiving sensor of a time-of-flight device are adapted to be provided on a non-display side of the preset area, and light emitted from the transmitting sensor is adapted to be transmitted from the preset area to a display side of the display panel, and be reflected by a to-be-detected object on the display side back to a non-display side of the display panel, so as to be received by the receiving sensor, the display panel comprising:
   a substrate layer;
   an organic light-emitting device layer provided on a display side of the substrate layer; and
   an anti-reflection layer comprising one or more anti-reflection layers and provided between the substrate layer and the organic light-emitting device layer, at least part of the anti-reflection layer being disposed opposite to the preset area in a thickness direction of the display panel, wherein at least one of the one or more anti-reflection layers is made of polyimide.

2. The display panel according to claim 1, wherein one of the one or more anti-reflection layers is a preset thin film layer, and the preset thin film layer is disposed immediately adjacent to the substrate layer.

3. The display panel according to claim 2, wherein the display panel comprises only the preset thin film layer as the anti-reflection layer, and the display panel further comprises a buffer layer disposed immediately adjacent to a display side of the preset thin film layer.

4. The display panel according to claim 3, wherein the light emitted from the transmitting sensor has a wavelength of 940 nm, the substrate layer comprises polyimide and has a refractive index of 1.945, the buffer layer has a refractive index of 1.467, the preset thin film layer has a refractive index of 1.625 or 1.691, and the preset thin film layer has a thickness of 235 nm.

5. The display panel according to claim 1, wherein a projection of at least one of the one or more anti-reflection layers in the thickness direction of the display panel completely covers the substrate layer.

6. The display panel according to claim 1, wherein a projection of at least one of the one or more anti-reflection layers in the thickness direction of the display panel exactly covers the preset area.

7. The display panel according to claim 1, wherein a refractive index $n_x$ of the anti-reflection layer satisfies:
   $n-0.2 \leq n_x \leq n+0.2$, wherein $n=(n_1 \times n_2)^{(1/2)}$, $n_1$ is a refractive index of a film layer immediately adjacent to a non-display side of a corresponding anti-reflection layer, and $n_2$ is a refractive index of a film layer immediately adjacent to a display side of the corresponding anti-reflection layer.

8. The display panel according to claim 1, wherein a thickness $d_x$ of the anti-reflection layer satisfies:

d−50 nm≤$d_x$≤d+50 nm, wherein $d_x$=λ/4, and λ is a wavelength of the light emitted from the transmitting sensor.

9. The display panel according to claim 1, wherein an extinction coefficient k of the anti-reflection layer satisfies: k≤1.

10. The display panel according to claim 1, wherein the organic light-emitting device layer comprises an electron transport layer, and at least one of the one or more anti-reflection layers is made of the same material as that of the electron transport layer.

11. A display apparatus, comprising:
a display panel provided with a preset area; and
a time-of-flight device comprising a transmitting sensor and a receiving sensor both provided on a non-display side of the preset area, wherein light emitted from the transmitting sensor is transmitted from the preset area to a display side of the display panel, and is reflected by a to-be-detected object on the display side back to a non-display side of the display panel, so as to be received by the receiving sensor,
wherein the display panel comprises:
a substrate layer;
an organic light-emitting device layer provided on a display side of the substrate layer; and
an anti-reflection layer comprising one or more anti-reflection layers and provided between the substrate layer and the organic light-emitting device layer, at least part of the anti-reflection layer being disposed opposite to the preset area in a thickness direction of the display panel, wherein at least one of the one or more anti-reflection layers is made of polyimide.

12. The display apparatus according to claim 11, wherein one of the one or more anti-reflection layers is a preset thin film layer, and the preset thin film layer is disposed immediately adjacent to the substrate layer.

13. The display apparatus according to claim 12, wherein the display panel comprises only the preset thin film layer as the anti-reflection layer, and the display panel further comprises a buffer layer disposed immediately adjacent to a display side of the preset thin film layer.

14. The display apparatus according to claim 13, wherein the light emitted from the transmitting sensor has a wavelength of 940 nm, the substrate layer comprises polyimide and has a refractive index of 1.945, the buffer layer has a refractive index of 1.467, the preset thin film layer has a refractive index of 1.625 or 1.691, and the preset thin film layer has a thickness of 235 nm.

15. The display apparatus according to claim 11, wherein a projection of at least one of the one or more anti-reflection layers in the thickness direction of the display panel completely covers the substrate layer.

16. The display apparatus according to claim 11, wherein a projection of at least one of the one or more anti-reflection layers in the thickness direction of the display panel exactly covers the preset area.

17. The display apparatus according to claim 11, wherein a refractive index $n_x$ of the anti-reflection layer satisfies:
n−0.2≤$n_x$≤n+0.2, wherein n=$(n_1 \times n_2)^{(1/2)}$, $n_1$ is a refractive index of a film layer immediately adjacent to a non-display side of a corresponding anti-reflection layer, and $n_2$ is a refractive index of a film layer immediately adjacent to a display side of the corresponding anti-reflection layer.

18. The display apparatus according to claim 11, wherein a thickness $d_x$ of the anti-reflection layer satisfies:
d−50 nm≤$d_x$≤d+50 nm, wherein $d_x$=λ/4, and λ is a wavelength of the light emitted from the transmitting sensor.

19. The display apparatus according to claim 11, wherein an extinction coefficient k of the anti-reflection layer satisfies: k≤1.

* * * * *

UNITED STATES PATENT AND TRADEMARK OFFICE
CERTIFICATE OF CORRECTION

| | | |
|---|---|---|
| PATENT NO. | : 12,446,438 B2 | Page 1 of 1 |
| APPLICATION NO. | : 17/922475 | |
| DATED | : October 14, 2025 | |
| INVENTOR(S) | : Bo Shi | |

It is certified that error appears in the above-identified patent and that said Letters Patent is hereby corrected as shown below:

On the Title Page

Item (73), should read:
(73) Assignees: Chengdu BOE Optoelectronics Technology Co., Ltd., Chengdu, Sichuan (CN); Beijing BOE Technology Development Co., Ltd., Beijing (CN)

Signed and Sealed this
Eleventh Day of November, 2025

John A. Squires
*Director of the United States Patent and Trademark Office*